United States Patent [19]

Nishizawa

[11] Patent Number: 4,841,350
[45] Date of Patent: Jun. 20, 1989

[54] STATIC INDUCTION PHOTOTHYRISTOR HAVING A NON-HOMOGENEOUSLY DOPED GATE

[76] Inventor: Jun-ichi Nishizawa, 6,16, Komegafukuro, 1-chome, Sendai-shi, Miyagi 980, Japan

[21] Appl. No.: 131,347

[22] Filed: Dec. 9, 1987

Related U.S. Application Data

[63] Continuation of Ser. No. 910,268, Sep. 19, 1986, abandoned, which is a continuation of Ser. No. 610,299, filed as PCT JP83/00284 on Aug. 30, 1983, published as WO84/01054 on Mar. 15, 1984, abandoned.

[30] Foreign Application Priority Data

Aug. 30, 1982 [JP] Japan .................................. 57-150300

[51] Int. Cl.⁴ ................................. H01L 27/14
[52] U.S. Cl. .................................. 357/30; 357/58; 357/38; 357/56; 357/20
[58] Field of Search ............. 357/34, 51, 55, 58, 357/38, 38 S, 38 LA, 30 D, 30 F, 30 O, 30 R, 56, 22, 20, 92

[56] References Cited

U.S. PATENT DOCUMENTS

| | | | |
|---|---|---|---|
| 4,000,506 | 12/1976 | Hirai et al. | 357/34 |
| 4,146,906 | 3/1979 | Miyata et al. | 357/38 X |
| 4,151,540 | 4/1979 | Sander et al. | 357/34 |
| 4,187,517 | 2/1980 | Platzöder | 357/38 X |
| 4,224,083 | 9/1980 | Cresswell | 357/38 X |
| 4,282,542 | 8/1981 | Silber et al. | 357/38 |
| 4,291,325 | 9/1981 | Sueoka et al. | 357/38 |
| 4,295,058 | 10/1981 | Lade et al. | 357/38 X |
| 4,337,473 | 6/1982 | Nishizawa | 357/20 X |
| 4,427,990 | 1/1984 | Nishizawa | 357/56 X |

FOREIGN PATENT DOCUMENTS

| | | | |
|---|---|---|---|
| 0525273 | 1/1977 | Japan | 357/34 |
| 53-124086 | 10/1978 | Japan | 357/38 |

OTHER PUBLICATIONS

Nishizawa et al, "Current Amplification in Non-homogeneous-Base Structure and Static Induction Transistor Structure," *J. Appl. Phys*, 57(10), May 15, 1985, pp. 4783–4797.

Primary Examiner—Andrew J. James
Assistant Examiner—William A. Mintel
Attorney, Agent, or Firm—McGlew & Tuttle

[57] ABSTRACT

In a photothyristor provided with a cathode, a gate and an anode, the impurity densities of gate (base) portions 20 and 21 are made unequal to each other. The minority carriers are stored in the high impurity density regions 20, the majority carriers are permitted to readily pass through the low impurity density regions 21, and the high and low impurity density regions are electrically coupled together. This thyristor is extremely high in sensitivity and high-speed in operation.

14 Claims, 6 Drawing Sheets

4,841,350

STATIC INDUCTION PHOTOTHYRISTOR HAVING A NON-HOMOGENEOUSLY DOPED GATE

This application is a continuation of application Ser. No. 910,268, filed Sept. 19, 1986, now abandoned, which is a continuation of Ser. No. 610,299 filed as PCT JP83/00284 on Aug. 30, 1983, published as WO84/01054 on Mar. 15, 1984, now abandoned.

TECHNICAL FIELD

The present invention relates to a high-speed and high-sensitivity semiconductor device and, more particularly, to a photothyristor.

BACKGROUND ART

Conventional thyristors of a p-n-p-n structure are high in base resistance, and hence have the defects that they are not sensitive enough to light and are low in operating speed.

FIG. 1 shows a conventional light-triggered thyristor. This has a p-n-p-n four-layered struct re, 1 being an anode electrode, 2 a cathode electrode and 3 a gate electrode. 10 is a light input directed to the thyristor.

When irradiated by light, the thyristor conducts. Sometimes the gate electrode 3 is not activated. Since the conventional light trigger thyristor is high in the resistance of its p-type base, as shown in FIG. 1, it takes time for the entire device to turn ON. Because of this, the frequency at which the thyristor can be switched is very low.

An object of the present invention is to provide a photothyristor which is higher in photo sensitivity and faster in switching operation than the above mentioned conventional light trigger thyristor.

SUMMARY OF THE INVENTION

In the photothyristor of the present invention, the impurity density of a p-type (or n-type) gate is distributed nonuniformly in a plane perpendicular to a current flow. Optically excited carriers which are of the same conductivity type as that of the gate are stored in high impurity density regions of the gate and carriers reverse in conductivity type from the abovesaid carriers are permitted to easily pass through low impurity density regions of the gate. Further, the photothyristor of the invention has the feature that the high and low impurity density regions are electrically coupled with each other. With the above mentioned arrangement, the present invention permits the reduction of the gate resistance, allows a high-speed operation and raises the photosensitivity to a high level.

BRIEF DESCRIPTION OF THE DRAWINGS

FIGS. 6A to F illustrate other embodiments of the operating circuit for the light-triggered thyristor of the present invention.

BEST MODE FOR CARRYING OUT THE INVENTION

With reference to the drawings, the present invention will hereinafter be described in detail.

Figure 1:
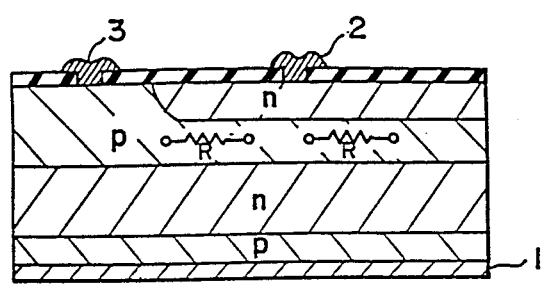
FIG. 1 is a schematic cross-sectional view of a conventional light-triggered thyristor.
Figure 2A:
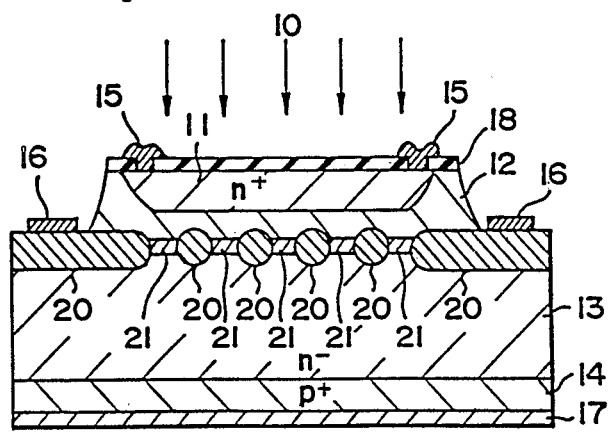
FIGS. 2A to D illustrate embodiments of the present invention in which high impurity density regions of their p-type bases (gates) are of different shapes.

FIG. 2A illustrates an embodiment of the present invention. Reference numeral 13 indicates an n-type high resistivity silicon substrate. By a selective diffusion of boron, a $p^+$ region 14 is formed which will ultimately serve as an anode and high impurity density regions 20 are formed as a p gate. A high resistivity $n^-$ layer 12 is grown about 10 $\mu$m thick on the p gate 20 by means of a vapor growth method using, for example, $SiCl_4$ and $H_2$ gas. During the growth relatively low impurity density P gate regions 21 are formed by autodoping from the high impurity density regions 20 of the p gate simultaneously with the epitaxial growth of the above mentioned layer. Next, a high impurity $n^+$ region 11 is formed as a cathode by using phosphorus. Insulation layer 18 is provided over regions 11 and 12. The high impurity density regions 20 of the p base are partly exposed by chemical etching, as shown. By vapor deposition of aluminum in a high vacuum, a cathode electrode 15, a gate electrode 16 and an anode electrode 17 are formed. To facilitate sufficient irradiation of the light sensitive layers by the optical input 10, the cathode electrode 15 is provided, not all over the cathode, but only at the peripheral portion thereof.

A description will now be given of the operation of this embodiment. In its forward blocking state and reverse blocking state this thyristor operates in the same manner as does an ordinary thyristor. Upon creation of electron-hole pairs by the optical input 10, electrons flow across the high resistance $n^-$ region to gather in the vicinity of the $n^-p^+$ junction between the $n^-$ region and the anode. On the other hand, holes charge the high impurity density regions 20 of the p gate positive, reducing the potential barrier between the cathode and the gate to switch the thyristor to the ON state. At this time, the electrons from the cathode pass mainly through the low impurity density regions 21 of the p gate region which are low in diffusion potential. Since the resistance of the p gate is made much lower than in the conventional thyristor owing to presence of the high impurity density regions 20, the photosensitivity rises, to a high level. The electrostatic capacitance between the cathode and the gate electrode is also reduced by the presence of the high resistivity region 12 between the p gate regions 20 and 21 and the $n^+$ cathode region 11. Since the time constant decreases, which is the product of the gate resistance and the capacitance between the cathode and the gate, the switching speed becomes very high.

The conventional thyristor has the disadvantage of being difficult to speed up because much time is consumed until the entire device is turned ON after the gate electrode and its vicinity are turned ON. With the thyristor of the present invention, however, since the p gate has its high impurity density regions arranged all over the device to thereby reduce the gate resistance, the time for turning ON the entire device can be cut down.

The high impurity density regions 20 in the p gate region shown in FIG. 2A need only to be provided in a parallel-line, grid-like, mesh-like or honeycomb form. In FIG. 2A the high impurity density regions 20 of the p gate are formed thicker than the low impurity density regions of the p base, causing the electrons from the cathode to be injected exclusively through the low impurity density p gate regions 21.

It is desirable for raising the injection efficiency that the impurity densities of the anode region 14 and the cathode region 11 be as high as possible. Their impurity densities are selected to be higher than about $1 \times 10^{18}$ cm$^{-3}$. It is desirable that the impurity density of the high impurity density regions 20 of the p type gate be as high as possible, and it is selected to be approximately $1 \times 10^{18}$ cm$^{-3}$. Boron largely differs in its convalent bonding radius from silicon, and in the case where it is diffused into an n$^-$ substrate, since dislocations occur due to lattice mismatching at a density exceeding about $1 \times 10^{19}$ cm$^{-3}$, it is necessary to prevent the occurrence of lattice distortions by simultaneously adding a Group VI element, such as, for example, germanium or tin, thereby raising the boron density as high as possible.

The impurity density of the high resistivity n$^-$ channel region is selected to be lower than $1 \times 10^{14}$ cm$^{-3}$ or so, and its thickness is determined in accordance with the forward blocking voltage that is desired. With a resistivity of approximately 500 $\Omega$cm and a thickness of 300 $\mu$m, a forward blocking voltage of between some 600 to 700 V can be obtained. The forward and reverse blocking voltages are dependent mainly upon the surface treatment of the device, and a breakdown voltage up to 10 KV or so can be achieved by a double beveled structure, a double positive beveled structure and a vacuum baking step after mesa etch, resin coating and a package having sealed therein an inert gas.

Figure 2B:
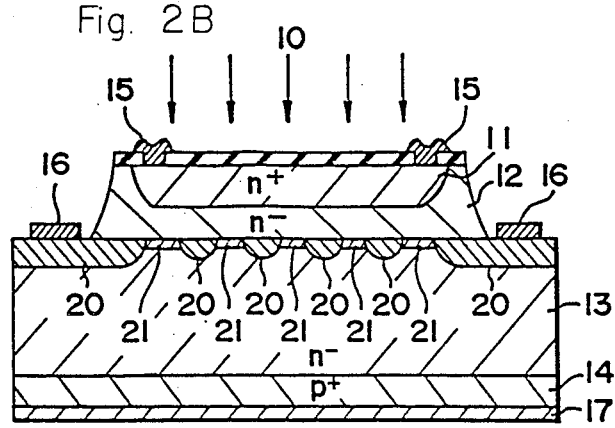
Figure 2C:
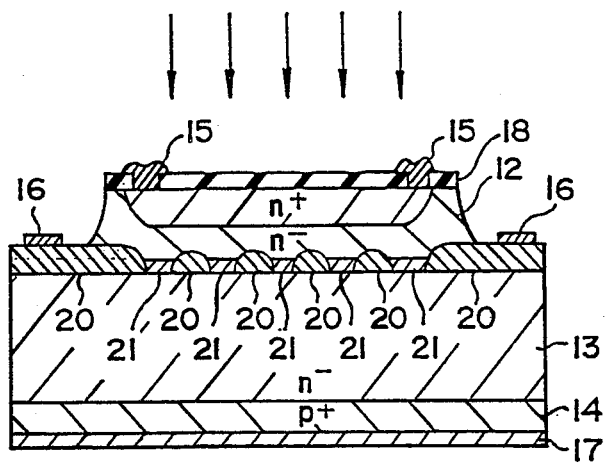
Figure 2D:
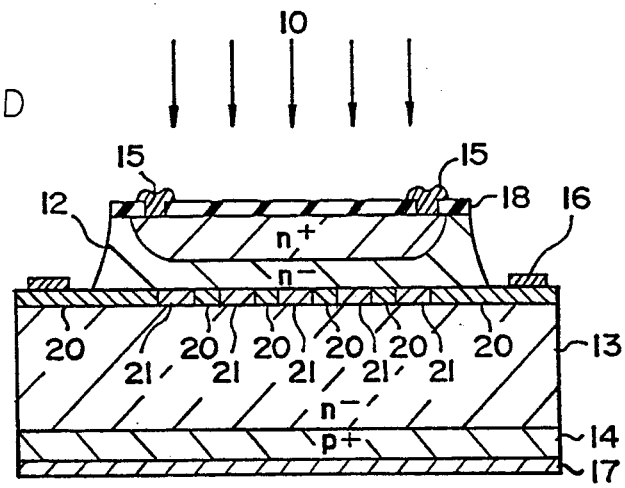

FIGS. 2B to D illustrate other embodiments of the invention in which the high impurity density regions 20 and the low impurity density regions 21 are formed in different shapes by using different manufacturing steps. In FIG. 2B the junction portion between the gate 20, 21 and the cathode 11, 12 is flat and the p+ regions 20 of the gate 20, 21 project out to the side of the junction between the gate and the anode 14. In FIG. 2C the p+ regions 20 of the gate project out towards the cathode 11, 12 unlike in FIG. 2B. In FIG. 2D the gate portion 20, 21 is formed uniformly thick.

Figure 3A:
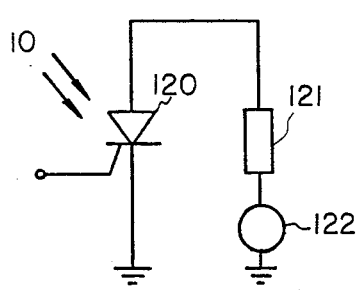
FIG. 3 shows, by way of example, operating circuits for a light-triggered thyristor according to the present invention, A being the case where the gate is open, B an example in which the sensitivity is made variable by an external gate resistance and C an embodiment in which a gate voltage circuit is provided for turning OFF the gate.
Figure 3B:
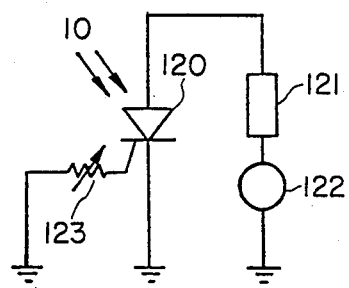
Figure 3C:
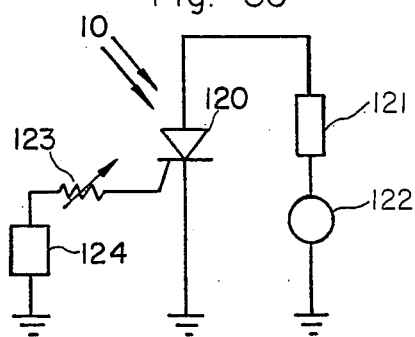

FIGS. 3A to C show embodiments of an ON-OFF circuit of the photothyristor of the present invention. FIG. 3A shows the case where the gate electrode is made floating without any particular connection thereto, and the photothyristor 120 of the present invention is turned ON by the optical input 10. Reference numeral 121 indicates a load and 122 an anode-cathode power source. This is an embodiment in which the thyristor is turned OFF by cutting off the optical input 10 to reduce the anode voltage to a level that is lower than a holding current, or by a commutation circuit.

The embodiment shown in FIG. 3B is an example in which since the base resistance of the photothyristor of the present invention is low, an external resistor 123 is made variable, thereby improving the turn-ON sensitivity higher than in the case of FIG. 3A.

FIG. 3C shows an embodiment in which the thyristor is turned OFF by applying a reverse voltage to the gate electrode, instead of using the commutation circuit and lowering the holding current by reducing the anode-cathode voltage as in the cases of FIGS. 3A and B. Reference numeral 124 designates a circuit for generating a reverse voltage which is applied across the gate and cathode.

By applying the highest possible reverse voltage within the range of the breakdown voltage across the cathode and the gate, the main current cutoff performance can be improved and the turn-OFF time can be shortened. Specifically, the turn-OFF time can easily be reduced to less than 1 $\mu$sec.

It is also possible to employ turn-OFF circuits utilizing a gate C, R circuit and an R, L circuit, in addition to the embodiments shown in FIG. 3.

Figure 4A:
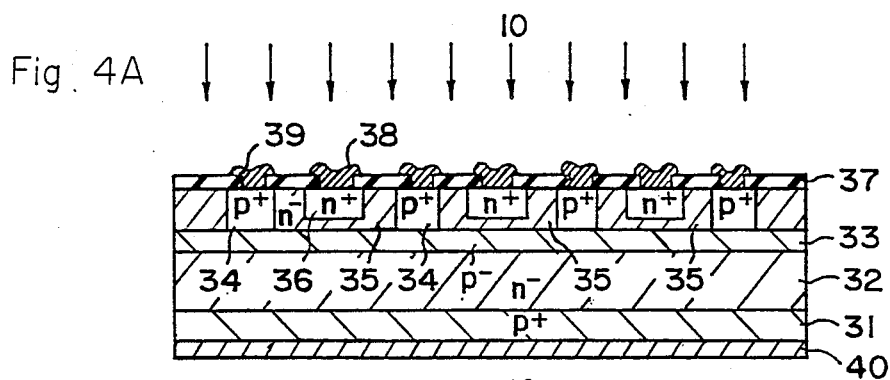
FIGS. 4A to E illustrate other embodiments of the present invention.
Figure 4B:
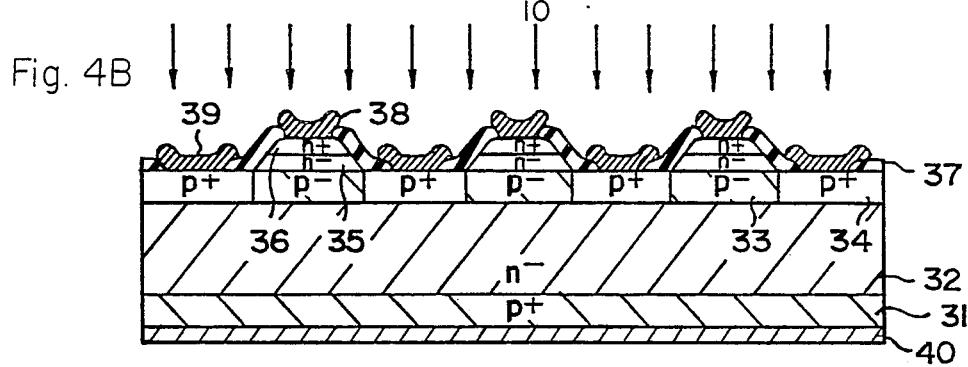
Figure 4C:
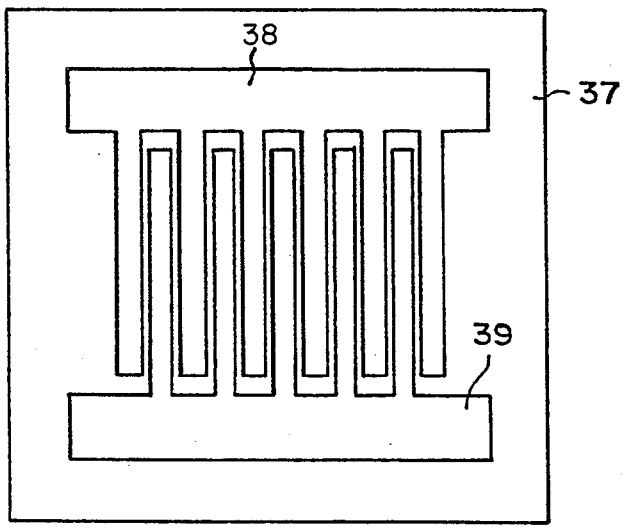

FIGS. 4A to C illustrate other embodiments of the present invention. These embodiments are formed so that the high impurity density regions of the p type gate are all interconnected through metallic wiring so as to reduce the gate resistance and the stray capacitance between the cathode and the gate electrode.

In FIG. 4A, reference numeral 31 indicates a p type high impurity density anode region, 32 a high resistivity n$^-$ or intrinsic semiconductor region, 34 high impurity density p type gate regions, 33 a p type gate region lower in impurity density when the gate regions 34, 35 high resistivity n$^-$ or intrinsic semiconductor regions of a cathode region, 36 high impurity density cathode regions and 37 an SiO$_2$ film. Reference numerals 38, 39 and 40 identify cathode, gate and anode electrodes, respectively. By the metallic interconnection of the gate electrodes on the surfaces thereof, the gate resistance is reduced much more than in the embodiments shown in FIG. 2.

In the embodiment of FIG. 4B, the high impurity density regions 34 of the p type gate are formed to underlie the cathode, thereby reducing the gate resistance and diminishing an excess interelectrode capacitance between the cathode and gate as in the embodiment of FIG. 4A.

Figure 4D:
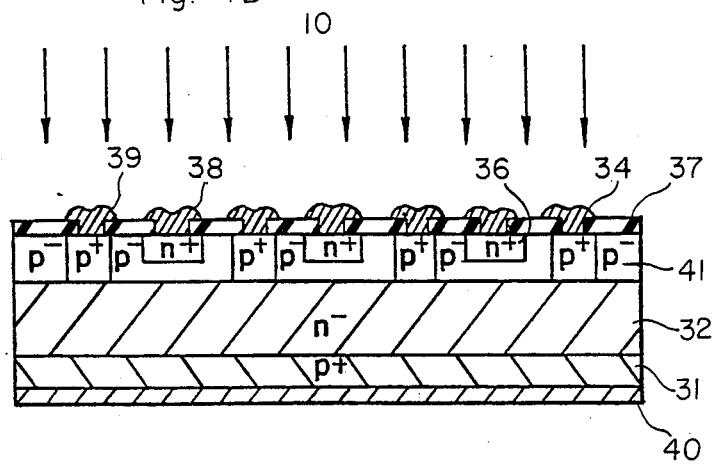
Figure 4E:
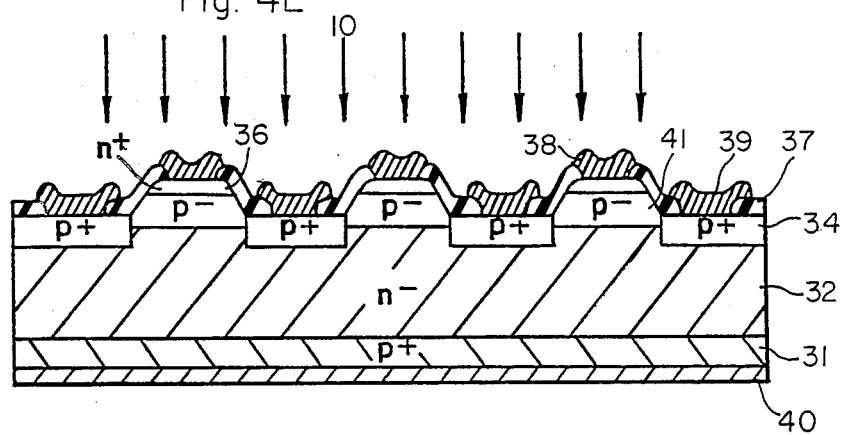

FIGS. 4D and E illustrate other embodiments similar to those of FIGS. 4A and B. Reference numeral 37 designates an insulating material such as SiO$_2$ or Si$_3$N$_4$.

In FIGS. 4B and E, the high impurity density regions of the p type gate can be formed deeply by chemical etching, plasma etching or a method employing an SiO$_2$ film and an Si$_3$N$_4$ film. P$^-$ high resistivity regions 41 are high resistivity gate regions, which are capacitively coupled with the high impurity density gate regions 34.

FIG. 4C is a top plan view of the semiconductor device of each of the embodiments shown in FIGS. 4B, D and E. Reference numeral 38 indicates a cathode electrode and 39 a gate electrode, both of which are comb-shaped.

Figure 5A:
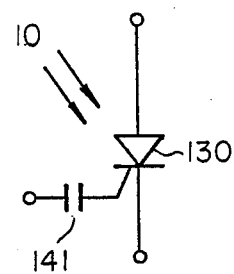
FIGS. 5A to C show embodiments of operationg circuits in each of which a capacitor is connected to the gate, cathode and anode of the light-triggered thyristor of the present invention respectively.
Figure 5B:
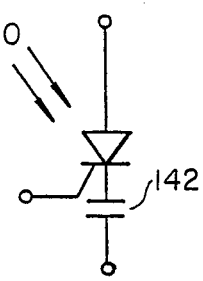
Figure 5C:
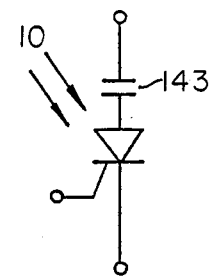

FIGS. 5A to C illustrate other embodiments of the photothyristor of the present invention in which a capacitor is connected to the gate, cathode and anode electrodes, respectively. By connecting capacitors 141, 142 and 143 to the respective electrodes of a photothyristor 130, the photo thyristor of the present invention can store a light signal by the optical input 10 in the capacitor connected to each electrode. The photothyristor of the present invention, equipped with such a function, can also be applied to a random access image sensor for optical information and various image sensors having a storage function.

Figure 6A:
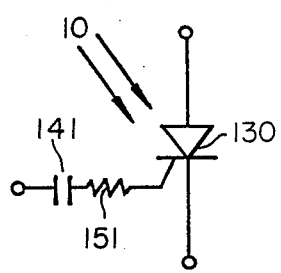
Figure 6B:
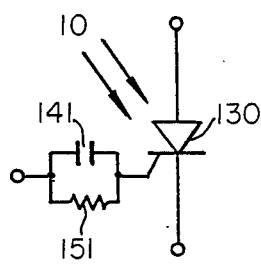
Figure 6C:
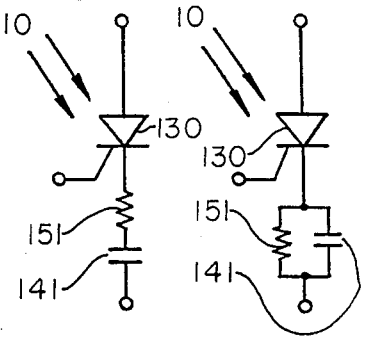
Figure 6E:
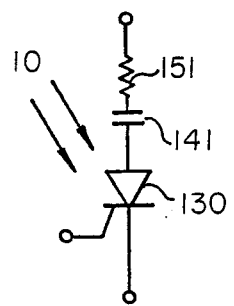
Figure 6F:
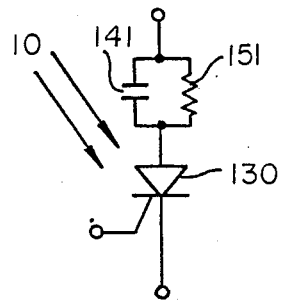

FIGS. 6A and B illustrate other embodiments of the photothyristor of the present invention in which the capacitor 141 and a resistor 151 are connected to its gate electrode. The utilization of the CR time constant extends the function of the photothyristor. FIGS. 6C to F show other embodiments in which the cathode and the anode have a CR time constant.

While the photothyristor uses the p base as the gate, it is needless to say that its conductivity type can be reversed.

The material for the photothyristor of the present invention is not limited specifically to silicon but may also be germanium, or GaAs and InP which are the Group III–V compound semiconductors, $Ga_{1-x}Al_xAs$, InGaP, InGaAsP and so forth which are mixed crystals thereof, or the Group II–VI compound semiconductors. Further, the thyristor of the present invention is usable not only with light but also with an electron beam and a charged particle beam.

AVAILABILITY FOR INDUSTRIAL USE

As has been described in the foregoing, the photothyristor of the present invention has characteristics of high-speed operation and high sensitivity and is of wide use for processing of various optical signals, such as, for example, a random access image sensor for optical information and various image sensors equipped with a storage function.

I claim:

1. A static induction type photothyristor having a non-homogeneously impurity doped gate structure, which comprises a cathode region of one conductivity type, a gate region and an anode region formed in a high resistivity semi-conductor substrate, the cathode and gate regions being connected at a first junction and the anode and gate regions being connected at a second junction, characterised in that the distribution profile of the impurity in the gate region is non-homogeneous in a gate plane perpendicular to a current flow direction between the cathode region and anode region and includes high impurity concentration region portions, and, with respect to said high impurity concentration region portions, low impurity concentration region portions, the impurity concentrations of said low impurity concentration region portions are sufficiently low to be completely depleted by a built-in potential between said low and high impurity region portions, no neutral region being formed in the low impurity concentration region portions of the gate region, whereby optically excited minority carriers are stored in the high impurity concentration region portions and majority carriers are permitted to easily pass through the low impurity concentration region portions of the gate region, and in that the high and low impurity concentration regions of said gate region are constructed so that their potential voltages relative to said cathode region are capacitively-coupled together so that the potential voltage of the low impurity concentration region portions of the gate region capacitively vary with that of the high impurity concentration regions of the gate region, and said cathode region is formed on a first surface of said semi-conductor substrate and said anode region is formed on another surface reverse from said first surface of said semi-conductor substrate, a cathode electrode is formed on said anode region, and an optical window area is formed on said cathod electrode to permit the penetration of triggering light, a gate electrode being formed on peripheral high impurity concentration region portions of the gate region, and the conductivity type of said gate region portions is the same as that of said anode region and is reverse from that of said cathode region, concentrations of said high impurity concentration region portions of the gate region are at least one order of magnitude higher than that of said low impurity concentration region portions.

2. The photothyristor of claim 1, including, with respect to the gate region a high resistivity region of the one conductivity type connected between the cathode region and the gate region.

3. The photothyristor of claim 2, wherein the high impurity concentration region portions of the gate region are thicker between the first and second junctions than the low impurity concentration region portions.

4. The photothyristor of claim 1, wherein the means for capacitively-coupling comprises the high and low impurity concentration region portions being connected to each other in side by side relationship.

5. The photothyristor of claim 1, wherein the means for capacitively-coupling comprises the low impurity concentration region portions being formed as a single layer between the first and second junctions, the high impurity concentration regions connected at spaced locations on a single layer, a gate electrode connected to each of the high impurity concentration region portions with each gate electrode connected to each other gate electrode.

6. The photothyristor according to claim 4, including a gate electrode connected to each high impurity concentration region portions each gate electrode connected to each other gate electrode.

7. A static induction type photothyristor of claim 2 wherein said high and low impurity concentration region portions of said gate region lie in a common plane, high impurity concentration region portions at the ends of the planes comprising the peripheral high impurity concentration gate region portions which carry the gate electrode, a second high resistivity region of the one conductivity type connected between the anode region and the gate region, the cathode region being embedded in said second high resistivity region, the cathode region and said second high resistivity region having a common outer plane spaced away from the gate region and carrying an insulation layer covering the window, said cathode electrode being connected to the surface of the cathode region through the insulation layer.

8. A photothyristor of claim 7 wherein the impurity densities of the anode and the cathode regions in their respective conductivity types, are selected to be higher than about $1 \times 10^{18}$ cm$^{-3}$, the impurity density of the high impurity concentration gate region portions being approximately $1 \times 10^{18}$ cm$^{-3}$.

9. The photothyristor of claim 8 wherein the second high resistivity region has an impurity density which is lower than $1 \times 10^{14}$ cm$^{-3}$, the thickness of the second high resistivity region being determined in accordance with a forward blocking voltage, the resistivity being approximately 500 Ωcm and having a thickness of 300 μm, for a forward blocking voltage of between 600–700 V.

10. A static induction type photothyristor, which comprises a cathode region of first conductivity type;
an anode region of second conductivity type;
a gate region of second conductivity type having high impurity concentration region portions, and, with respect to said high impurity concentration region portions, low impurity concentration region portions, which region portions form a gate plane perpendicular to a current flow direction between said cathode region and said anode region;

a first semiconductor region of first conductivity type, interposed between said gate region and said anode region;

a second semiconductor region of first conductivity type, interposed between said gate region and said cathode region;

and an optical window formed on said cathode region; wherein said low impurity concentration region portions alternate with said high impurity concentration region portions across the plane, the impurity concentrations of said low impurity concentration region portions being sufficiently low to be completely depleted by a built-in potential between said low and high impurity concentration region portions, said high impurity concentration region portions being in contact with said second semiconductor region.

11. The photothyristor of claim 10, wherein said high impurity concentration region portions are thicker, as measured perpendicularly to the gate plane, than said low impurity concentration region portions.

12. The photothyristor of claim 10, wherein said high and low impurity concentration region portions lie in a common plane, said cathode region being embedded in said second semiconductor region, said cathode region and said second semiconductor region lying in a common plane spaced apart outwardly from the gate region.

13. The photothyristor of claim 10, wherein the impurity concentration of said first semiconductor region is lower than $1 \times 10^{14}$ cm$^{-3}$.

14. The photothyristor of claim 10, wherein the impurity concentration of said second semiconductor region is lower than $1 \times 10^{14}$ cm$^{-3}$.

* * * * *